US006177838B1

United States Patent
Chiu

(10) Patent No.: US 6,177,838 B1
(45) Date of Patent: Jan. 23, 2001

(54) CMOS GAIN BOOSTING SCHEME USING POLE ISOLATION TECHNIQUE

(75) Inventor: Yun Chiu, Fremont, CA (US)

(73) Assignee: PixArt Technology, Inc., Fremont, CA (US)

( * ) Notice: Under 35 U.S.C. 154(b), the term of this patent shall be extended for 0 days.

(21) Appl. No.: 09/200,180

(22) Filed: Nov. 25, 1998

(51) Int. Cl.[7] .................................. H03F 3/45; H03F 1/22
(52) U.S. Cl. ............................................. 330/253; 330/311
(58) Field of Search ..................................... 330/253, 277, 330/311

(56) References Cited

U.S. PATENT DOCUMENTS 5,039,954 * 8/1991 Bult et al. ........................ 330/311 X

OTHER PUBLICATIONS

Klaas Bult, et al., "A Fast–Setting CMOS Op Amp with 90dB DC–gain and 116MHz Unity–Gain Frequency," Feb. 15, 1990, pp. 108–109, 1990 IEEE Internation Solid–State Circuits Conference.

Klaas Bult, et al., "The CMOS Gain–Boosting Technique," Jan. 9, 1991 (Revised Apr. 5, 1991), pp. 119–135, *Analog Integrated Circuits and Signal Processing I*.

* cited by examiner

Primary Examiner—Steven J. Mottola
(74) Attorney, Agent, or Firm—Oppenheimer, Wolff & Donnelly, LLP; Claude A. S. Hamrick

(57) ABSTRACT

A gain enhanced cascoded CMOS amplifier includes: a cascading transistor having its source connected to a folding point node, its drain connected to a first amplifier output terminal, and a gate, the folding point node being coupled to a first power supply terminal; a gain enhancing circuit having a negative input terminal coupled to the first folding point node, a positive input terminal responsive to a first reference voltage source, and an output terminal coupled to the gate of the first cascoding transistor; a first output coupling circuit coupling the first amplifier output terminal to a second power supply terminal; a first input transistor having a gate responsive to a first input voltage, a source, and a drain, the first input transistor having particular physical dimensions; and a first pole-isolating transistor having a drain connected to the first folding point node, a source connected to the drain of the first input transistor, and a gate responsive to an isolation bias voltage, the first pole isolating transistor having smaller physical dimensions than the particular physical dimensions of the first input transistor, wherein capacitive loading at the first folding point node is minimized to provide optimal settling behavior and stability in operation of the amplifier.

20 Claims, 7 Drawing Sheets

(BACKGROUND)**

(BACKGROUND)**

(BACKGROUND)**

(BACKGROUND)

(BACKGROUND)

CMOS GAIN BOOSTING SCHEME USING POLE ISOLATION TECHNIQUE

BACKGROUND OF THE INVENTION

1. Field of the Invention

The present invention relates generally to complementary metal oxide semiconductor (CMOS) circuitry, and more specifically to a gain enhanced cascoded CMOS operational amplifier circuit providing faster settling time without sacrificing stability and accuracy.

2. Description of the Prior Art

Analog signal processing circuits having CMOS operational amplifier (op-amp) circuits include switched-capacitor filters, algorithmic A/D converters, sigma-delta converters, sample- and hold amplifiers, and pipeline A/D converters. Analog signal processing applications typically require op-amp circuits having a high gain high accuracy analog signal processing systems typically require a gain of 60 dB to 100 dB. Gain is typically limited in CMOS op-amp circuits due to device characteristics. However, high gain is only one of several important op-amp circuit design parameters which further include accuracy and stability which are related to linearity and phase margin. In many cases, the speed and accuracy of a CMOS analog signal processing system is determined by the settling behavior of a CMOS operational amplifier circuit included therein As explained below, fast settling time in an op-amp circuit requires a high unity-gain frequency and preferably a single-pole settling behavior.

FIG. 1A shows a schematic diagram at 10 of a single transistor CMOS operational amplifier (op-amp) circuit including: a current source 12 having a terminal 14 connected to a system voltage source VDD, and an opposite terminal 16 connected to a node 18; an NMOS transistor 20 having a drain 22 connected to node 18, a gate 24 connected to receive an input voltage $V_i$, and a source 26 connected to a node 28; and a load capacitor 30 having a terminal connected to node 18, and an opposite terminal connected to node 28. An output voltage $V_O$ is developed across the load capacitor 30 between nodes 18 and 28, in response to the input voltage $V_i$ provided to gate 24 of the transistor 20.

FIG. 1B shows a schematic diagram at 40 of an AC small signal equivalent circuit of the single transistor CMOS op-amp circuit 10 (FIG. 1A). The equivalent circuit 40 includes: a voltage controlled current source 42 having a first terminal connected to a node 44, and an opposite terminal connected to a node 46; an output resistance element 48 having an output impedance value $r_o$, and having a terminal connected to node 44, and an opposite terminal connected to node 46; and a load capacitive element 50 having a load capacitance value $C_L$, and having a terminal connected to node 44, and an opposite terminal connected to node 46. The input voltage $V_i$ is represented across a terminal 52 and node 46, and the output voltage $V_O$ is represented across nodes 44 and 46. The output impedance value $r_o$ represents the output impedance of the op-amp circuit 10 (FIG. 1A) looking into the output node 18 (FIG. 1A). The voltage controlled current source 42 provides a current, i, having a value expressed according to Relationship (1), below, $$i=(g_m*V_i) \quad (1)$$

wherein $g_m$ represents the transconductance of the NMOS transistor 20 (FIG. 1A).

The DC gain, $A_{DC}$, of the op-amp circuit 10 (FIG. 1A) may be generally expressed in accordance with Relationship (2), below.

$$A_{DC}=V_{out}/V_{in}=(g_m*r_o) \quad (2)$$

The gain as a function of frequency of the circuit 10 (FIG. 1A) may be generally expressed in accordance with Relationship (3), below, $$A(f)=A_{DC}/(1+j*f/f_0) \quad (3)$$

wherein $f_0$, is the pole frequency of the circuit 10 (FIG. 1A) which is equal to $1/(2*\pi*r_o*C_L)$.

FIG. 1C shows a bode plot at 60 representing the gain 61, or frequency response of the single transistor op-amp circuit 10 (FIG. 1A). The depicted bode plot includes an AY-axis 62 representing the log of the gain of the single transistor op-amp expressed in decibels (dB), and an X-axis 64 representing the log of frequency. Between DC (f=0) and a first pole frequency $f_0$, the gain 61 is approximately equal to $A_{DC}$. At the first pole frequency $f_0$, the gain begins to roll off at negative 20 dB/decade, at a slope of −1 on the log—log scale. The first pole frequency, which is associated with the load capacitance $C_L$ and output impedance $r_o$ of the circuit 10 (FIG. 1A), is also commonly referred to as the negative 3 dB frequency point, or the negative 3 dB bandwidth. At a unity gain frequency $f_u$, the gain 61 of the op-amp circuit 10 (FIG. 1A) is equal to 0 dB, which corresponds with a unity gain value. The unity gain frequency $f_u$ is equal to $(A_{DC}*f_0)$ for the single pole op-amp circuit 10 (FIG. 1A).

Due to a short channel effect in modern sub-micron CMOS processes, the gain provided by the single transistor CMOS op-amp circuit 10 (FIG. 1A) is limited to approximately 20 to 25 dB. However, gain is only one important design parameter. Speed and accuracy are also important properties of op-amp circuits. Typically, methods for increasing the gain of an op-amp circuit give rise to higher order poles.

Because of the demand for increased clock rates in switched capacitance circuits, fast-settling time is required for accuracy in op-amp circuits. Fast-settling time requires a high unity-gain frequency and preferably a single-pole settling behavior, whereas accurate settling requires a high DC-gain. The realization of a CMOS op-amp circuit that combines high DC-gain with high unity-gain frequency has been a difficult problem. A high DC gain is typically achieved using multistage designs with long-channel devices biased at low current levels, whereas a high unity-gain frequency is typically achieved using a single-stage design with short-channel devices biased at high current levels. Future processes with sub-micron channel length will enable the realization of higher unity-gain frequencies. However, the intrinsic MOS transistor gain, $(g_m*r_o)$, will then be lower, and the problem of achieving sufficient DC-gain becomes even more difficult.

Several circuit design approaches have been developed to circumvent this problem. Cascoding is a well-known means to enhance the DC-gain of an amplifier without severely degrading the high-frequency performance. The result is a DC-gain that is proportional to the square of the intrinsic MOS transistor gain $(g_m*r_o)$. However, cascoding does not provide optimal phase margin because power supply levels are decreasing in modern CMOS devices, head room between power supply rails is decreasing. The technique of cascoding is not amenable to decreased head room.

FIG. 2A shows a schematic diagram at 80 of a cascoded CMOS gain stage. The depicted gain stage 80 includes: a current source 82 having a terminal 84 connected to a system voltage source VDD, and an opposite terminal 86 connected to a node 88; a cascoded transistor 90 having a drain 92 connected to node 88, a gate 94 connected to receive a reference voltage $V_{ref}$, and a source 96 connected to a node 98; an input transistor 100 having a drain 102 connected to node 98, a gate 104 coupled to receive an input voltage $V_i$, and a source 106 connected to VSS. In the depicted circuit, both the cascoded transistor 90 and the input transistor 100 are NMOS transistors. The gain stage 80 further includes: a load capacitor 110 having a capacitance value $C_L$, and having a terminal connected to node 88, and an opposite terminal connected to VSS; and a parasitic capacitance element 112 having a capacitance value $C_P$, and having a terminal connected to node 98, and an opposite terminal connected to VSS.

An increased gain is achieved in the cascoded CMOS gain stage 80 over the single transistor op-amp 10 (FIG. 1A) in accordance with the method of cascading which increases the gain of an op-amp circuit by increasing the output impedance of the op-amp circuit. The DC-gain of an op-amp circuit is generally proportional to the output impedance of the circuit. Using modern CMOS processes, with short-channel devices and an effective gate-driving voltage of several hundred millivolts, a DC-gain of about 40–50 dB may be achieved in the cascoded CMOS gain stage 80. This, however, in many cases is not sufficient.

FIG. 2B shows a bode plot at 120 illustrating the gain 122 of the cascoded gain stage 80 (FIG. 2A) as a function of frequency on a log—log scale, and a phase margin plot at 124 illustrating the phase angle 126 of the cascoded gain stage 80 (FIG. 2A) as a function of frequency.

The bode plot 120 shows a first pole 128 of the cascoded gain stage 80 (FIG. 2A) at a first pole frequency 130. Beyond the first pole frequency 130, the gain 122 of the cascoded gain stage decreases at a rate of −20 dB/decade to 0 dB, unity gain, at a cascoded unity gain frequency 132. The bode plot 120 further shows a second pole 134 of the cascoded gain stage 80 (FIG. 2A) at a second pole frequency 136. The first pole 128 of the cascoded gain stage is a dominant pole and is associated with the capacitance at the output node 88 (FIG. 2A) due to capacitive elements including the load capacitance $C_L$ 110 (FIG. 2A). The second pole 128 of the cascoded gain stage is associated with the capacitance at node 98 (FIG. 2A) which is due to capacitive elements including parasitic capacitance $C_P$ 112 (FIG. 2A).

The graph at 124 shows that at DC (f=0), the cascoded gain stage 80 (FIG. 2A) has a phase angle of approximately 180 degrees which indicates perfect negative feed back providing excellent linearity in the cascoded gain stage 80 (FIG. 2A). As the frequency approaches the first pole frequency 130, the phase angle 126 begins to decrease and reaches 135 degrees at the first pole frequency 130. As the frequency increases beyond the first pole frequency 130, the phase angle 126 begins to decrease asymptotically toward 90 degrees as a result of the first pole. As the frequency approaches the second pole frequency 136, the phase angle 126 begins to decrease and reaches 45 degrees at the second pole frequency. As the frequency increases beyond the second pole frequency 134, the phase angle 126 decreases asymptotically toward zero degrees as a result of the second pole 134. The stability of the cascoded gain stage 80 (FIG. 2A) decreases proportionally with the depicted phase angle 126. It is desirable to maximize the frequency difference between the first pole frequency 130 and the second pole frequency 134 of the cascoded gain stage 80.

FIG. 3A shows a schematic diagram of a gain enhanced cascoded op-amp circuit at 150. The op-amp circuit 150 includes: a current source 152 having a terminal 154 connected to $V_{DD}$, and an opposite terminal 158 connected to a node 160; a cascoded transistor 162 having a drain 164 connected to node 160, a gate 166 connected to a node 168, and a source 170 connected to a node 172; an input transistor 174 having a drain 176 connected to node 172, a gate 178 connected to receive an input voltage $V_{IN}$, and a source 180 connected to $V_{SS}$; an additional gain stage 184 having a positive input terminal 186 coupled to receive a reference voltage $V_{REF}$, a negative input terminal 188 connected to node 172, and an output terminal 190 connected to node 168; and a load capacitor 194 having a terminal connected to node 160, and an opposite terminal connected to $V_{SS}$. A capacitive element 192 is formed between node 172 and $V_{SS}$, and a capacitive element 196 is formed between node 168 and $V_{SS}$. In the depicted circuit, both the cascoded transistor 162 and the input transistor 174 are NMOS transistors. The input transistor 174 is a large transistor, having a wide channel.

The gain enhanced cascoded op-amp circuit 150 is similar to the cascoded gain stage 80 (FIG. 2A), the difference being the provision of the additional gain stage 184 in accordance with a gain boosting technique. Klaas Bult and Govert Geelen discuss problems and solutions associated with the gain-boosting technique in "The CMOS Gain-boosting technique," (Analog Integrated Circuits and Signal Processing, vol. 1, no. 2, October 1991. pp. 119–35), which is incorporated herein by reference. The gain-boosting technique, which improves accuracy of cascoded CMOS circuits with minimal speed penalty allows for a high-frequency single-pole op-amp behavior with the high DC-gain of a multistage design. The cascoding effect of the cascading transistor 162 is increased by the additional gain stage 184 which further reduces feedback from the output node 160 to the drain 176 of the input transistor 174. The additional gain stage 184 provides additional gain, increased circuit output impedance, and isolation from noise resulting from the power supply. The additional gain stage 184 reduces the feedback from the output node 160 to the drain 176 of the input transistor 174. Moreover, the effective transconductance of the gain enhanced cascoded op-amp circuit 150 is slightly increased by the additional gain stage 184. The gain boosting technique is very useful in high speed sampled data analog signal processing systems such as switched capacitor filters, algorithmic A/D converters, sigma-delta converters, sample and hold amplifiers and pipeline A/D converters.

FIG. 3B shows a graph at 200 including: a first bode plot 122 of the original gain $A_{orig}$ of the cascoded gain stage 80 (FIG. 2A) as a function of frequency: a second bode plot 202 of an additional gain $A_{add}$ of the additional gain stage 184 (FIG. 3A) as a function of frequency; and a third bode plot 204 of a total gain $A_{tot}$ of the gain enhanced cascoded op-amp circuit 150 (FIG. 3A) as a function of frequency. The third bode plot 204 of the total gain includes a first pole 206 of the gain enhanced cascoded op-amp circuit 150 (FIG. 3A) at a frequency $\omega_1$. The second bode plot 202 of the additional gain $A_{add}$ reveals a first pole 208 of the additional gain provided by the additional gain stage 184 (FIG. 3A) at a frequency value $\omega_2$. The first bode plot 122 of the original gain $A_{orig}$ shows the first pole 210, or 3 dB bandwidth, of the cascoded gain stage 80 (FIG. 2A) at a frequency $\omega_3$. The additional gain $A_{add}$ provided by the additional gain stage 184 (FIG. 3A) has a unity gain value at a frequency value $\omega_4$. The total gain $A_{tot}$ of the enhanced cascoded op-amp circuit 150 (FIG. 3A) has a total unity gain value at a frequency value $\omega_5$.

As described by Bult and Geelen, a pole-zero doublet of the enhanced cascoded op-amp circuit 150 (FIG. 3A). located at the frequency value $\omega_4$, arises due to the use of the additional gain stage 184 (FIG. 3A). The pole-zero doublet at $\omega_4$ is associated with a capacitance at node 168 (FIG. 3A). The gain-boosting technique increases the output impedance $r_o$ by a factor approximately equal to $(A_{add}+1)$. The additional gain, $A_{add}$, of the additional gain stage 184 (FIG. 3A) decreases for frequencies above $\omega_2$ with a slope of −20 dB/decade. For frequencies above $\omega_4$, the additional gain, $A_{add}$, is less than one, and the additional gain is actually an attenuator.

As described by Bult and Geelen, at DC, a gain enhancement $A_{tot}/A_{orig}$, provided as a result of the gain boosting technique, is approximately equal to $[1+A_{add}(0)]$. For $\omega>\omega_1$, the output impedance, $r_o$, of the enhanced cascoded op-amp circuit 150 (FIG. 3A) is mainly determined by the load capacitance $C_{load}$ of the load capacitor 194 (FIG. 3A). This results in a first-order roll-off of $A_{tot}(\omega)$ as indicated by the first bode plot 204. This implies that $A_{add}(\omega)$ may have a first-order roll-off for $\omega>\omega_2$ as long as $\omega_2>\omega_1$. This is equivalent to the condition that the unity-gain frequency $\omega_4$ of the additional gain stage 184 (FIG. 3A) must be larger than the 3-dB bandwidth $\omega_3$ of the original cascoded gain stage 80 (FIG. 2A), but it can be much lower than the unity-gain frequency $\omega_5$ of the original cascoded gain stage 80 (FIG. 2A). The unity-gain frequencies of the enhanced cascoded op-amp circuit 150 (FIG. 3A) and the original cascoded gain stage 80 (FIG. 2A) are the same.

To obtain a first-order roll-off of the total transfer function, $A_{tot}(\omega)$, the additional gain stage 184 (FIG. 3A) does not have to be a fast stage. The additional gain stage can be implemented by a gain stage similar to the cascoded gain stage 80 (FIG. 2A) with smaller width and non-minimal length transistors biased at low current levels. Actually, as the additional gain stage 184 (FIG. 3A) forms a closed loop with the cascoded transistor 162 (FIG. 3A), stability problems may occur if the additional gain stage 184 is too fast. There are two important poles in this closed loop. One is the dominant pole of the additional gain stage, which is associated with node 168. The other is the pole at the source 170 of the cascoded transistor 162 which is equal to the second pole at $\omega_6$ of the original cascoded gain stage 80 (FIG. 2A). For stability reasons, the unity-gain frequency $\omega_4$ of the additional gain stage 184 (FIG. 3A) is set lower than the second pole frequency $\omega_6$ of the main amplifier. With reference to FIG. 3B, as described by Bult and Geelen, a safe range for the location of the unity-gain frequency $\omega_4$ of the additional gain stage 184 (FIG. 3A) is given by relationship (4), below $$\omega_3<\omega_4<\omega_6. \tag{4}$$

Generally, in designing op-amp circuits, there is a trade off between gain and speed. An inversely proportional relationship exists between the time constant of an op-amp circuit and the first pole frequency. A high pole frequency corresponds with a small time constant which yields a fast response time for the circuit. Therefore, it is desirable that the dominant pole have a high frequency pole value. A high frequency pole value corresponds with a "Fast pole". As the clock frequency value is increased in a system, it is desirable to reduce the time constant and increase the pole frequency values of op-amp circuits used therein in order to achieve fast settling time and therefore high accuracy in the system. However, as the speed of a CMOS op-amp circuit is increased, linearity and accuracy of the op-amp circuit tend to decrease. Therefore, it is a design goal to optimize the speed and accuracy of a CMOS op-amp circuit. It is the dominant pole of an op-amp circuit that determines the speed of a circuit.

The time-domain response (not shown) of a single-pole op-amp shows an exponential settling behavior without any overshoot or ringing. Single pole settling within a specified time window is well predictable. On the contrary, overshoot and ringing sacrifice the accuracy achieved by the op-amp circuit and make its behavior unpredictable and unreliable.

According to K. Bult and C T. Geelen (1990), the pole-zero doublet inherent to the gain-boosting architecture introduces slow-settling behavior when the additional gain stage is used in a feedback configuration. This leads to an extraordinarily long settling time before the op-amp circuit can reach its DC gain. Although the op-amp possesses high DC gain, it is practically useless. To solve this problem, the unity-gain bandwidth of the additional gain stage must be well controlled.

As described by Bult and Geelen, a pole-zero doublet at $\omega_4$, which is associated with the capacitance at node 168 of the enhanced cascoded op-amp circuit 150 (FIG. 3A), causes a slow settling behavior in the time response of the circuit 150 (FIG. 3A). With regard to the settling behavior of the enhanced cascoded op-amp circuit 150 (FIG. 3A), it is shown that a single-pole settling behavior demands a higher unity-gain frequency $\omega_4$ of the additional gain stage than a simple first-order roll-off in the frequency domain requires. As described by Bult and Geelen, the reason for this is the presence of the doublet.

FIG. 3C shows a graph at 230 including: a bode plot 232 of the closed loop gain $A_{CL}$ of the main amplifier of the enhanced cascoded op-amp circuit 150 (FIG. 3A) as a function of frequency: and the second bode plot 202 of the additional gain $A_{add}$ of the additional gain stage 184 (FIG. 3A) as a function of frequency. As described by Bult and Geelen, the bode plot 232 of the closed loop gain $A_{CL}$ indicates: a first pole 234 of the main amplifier of the gain enhanced cascoded op-amp circuit 150 (FIG. 3A) at a frequency $\beta\omega_5$, wherein $\beta$ is the feedback factor; and a second pole 236 of the main amplifier of the op-amp circuit 150 (FIG. 3A) at a frequency $\omega_6$. The second pole 236 of the main amplifier at $\omega_6$ is associated with a capacitance at node 172 (FIG. 3A) due to capacitive elements including the load capacitance $C_{LOAD}$ 194 (FIG. 3A).

If the unity-gain frequency 0)4 is less than $\beta\omega_5$, slow settling behavior would result. As described by Bult and Geelen, when the unity gain frequency $\omega_4$ of the additional gain stage 184 (FIG. 3A) is higher than the −3 dB bandwidth $\beta\omega_5$ of the closed-loop circuit, the time constant of the doublet is smaller than the main time constant, and the settling time of the gain enhanced cascoded op-amp circuit 150 (FIG. 3A) will not be increased by the doublet. Also, as described above, for reasons concerning stability, the unity-gain frequency $\omega_4$ of the additional gain stage 184 (FIG. 3A) must be lower than a second-pole frequency $\omega_6$ (not shown) of the main amplifier of the gain enhanced cascoded op-amp circuit 150 (FIG. 3A). This results in a "safe" area for the unity-gain frequency of the additional stage as expressed below in Relationship (5).

$$\beta\omega_5<\omega_4<\omega_6 \tag{5}$$

Therefore, the unity-gain frequency $\omega_4$ of the additional gain stage 184 (FIG. 3A) must be well controlled. An implementation satisfying relationship (5) may be achieved, even if $\beta=1$, because the capacitor $C_C$ associated with the additional gain stage 184 (FIG. 3A), which determines $\omega_4$, is much smaller than the load capacitor $C_{LOAD}$ of the op-amp circuit 150 (FIG. 3A) which determines $\omega_5$.

In very high speed op-amps, the second pole frequency $\omega_6$ of the main amplifier of the enhanced cascoded op-amp circuit 150 (FIG. 3A) is very close to $\beta\omega_5$ which is the closest dominant pole. Process limitations limit the ability to increase the second pole frequency $\omega_6$ of the main amplifier. What is needed is a method for increasing the range between $\beta\omega_5$ and $\omega_6$. It is desirable to increase $\omega_6$ to a higher value. However, the second pole frequency $\omega_6$ of the main amplifier of the enhanced cascoded op-amp circuit 150 (FIG. 3A) is determined by the capacitance at node 172 (FIG. 3A) which couples the drain 176 of the input transistor 174 with the source 170 of the cascading transistor 162. Because the input transistor 174 is a large transistor with a high drain capacitance at its drain 176, the capacitive loading at node 172 (FIG. 3A) is very high and it is therefore very difficult to increase the second pole frequency $\omega_6$ to a higher value. In other words, the second pole at the second pole frequency $\omega_6$ is not at very high frequency as desired due to the high capacitive loading at the node 172.

As explained further below, for a fully differential op-amp circuit topology, such as a folded cascoded topology, the second pole frequency $\omega_6$ is determined by the capacitance at a node which is capacitively loaded by a large input transistor, a cascoding transistor, and a current source transistor. Therefore, for a folded cascoded topology op-amp circuit, slow settling behavior is even more problematic because the range between $\beta\omega_5$ and $\omega_6$ is not very large.

Aside from the slow settling of the main amplifier of the enhanced cascoded op-amp circuit 150 (FIG. 3A) used in feedback, the settling behavior of the additional gain loop is also critical to the overall op-amp settling. With reference back to FIG. 3A, this additional gain loop can be analyzed independently. Two poles exist in the loop. In an open-loop sense, the capacitance at node 168 (FIG. 3A) causes a pole that corresponds to the −3 dB corner frequency of the additional gain stage 184 (FIG. 3A), while the capacitance at node 172 (FIG. 3A) causes another pole that is equal to the 2nd pole of the main amplifier of the enhanced cascoded op-amp circuit 150 (FIG. 3A). In a closed-loop sense, these two poles interact with each other and the closed gain-boosting loop shows a second-order frequency response. As described by Yun Chiu in "1-GHz CMOS Predistortion Circuits for Analog Fiber Optic Links," (MS. thesis, UCLA 1997), to ensure the optimal settling behavior of this local feedback loop, the ratio of the open-loop pole frequencies must satisfy the condition expressed in relationship (6), below, $$\omega_6 = 2A_{add}\omega_2 \qquad (6)$$

where $A_{add}$ is the DC gain of the additional gain stage, $\omega_2$ is bandwidth of the additional gain stage, and $\omega_6$ is the 2nd pole frequency of the main amplifier.

FIG. 4 shows a schematic diagram at 250 of a fully differential CMOS gain enhanced cascoded op-amp circuit having a folded cascoded topology. The depicted circuit includes: a first current source transistor 252 having a source 254 connected to VDD, a gate 256 connected to receive a first bias voltage BIAS 1, and a drain 258 connected to a first folding point node 260; a first cascoding transistor 262 having a source 264 connected to node 260, a gate 266 connected to a node 268, and a drain 270 connected to a first output node 272; a first additional gain stage 274 having a negative input terminal 276 connected to node 260, a positive input terminal 278 connected to receive a first reference voltage REF1, and an output terminal 280 connected to node 268; a second cascading transistor 284 having a drain 286 connected to node 272, a gate 288 connected to a node 290, and a source 292 connected to a node 294; a second additional gain stage 296 having a positive input terminal 298 connected to receive a second reference voltage REF2, a negative input terminal 300 connected to node 294, and an output terminal 302 connected to node 290; and a second current source transistor 306 having a drain 308 connected to node 294, a gate 310 connected to receive a second bias voltage BIAS2, and a source 312 connected VSS.

The op-amp circuit 250 also includes: a third current source transistor 316 having a source 318 connected to VDD, a gate 320 connected to receive the first bias voltage BIAS1, and a drain 322 connected to a second folding point node 324; a third cascoding transistor 326 having a source 328 connected to node 324, a gate 330 connected to a node 332, and a drain 334 connected to a second output node 336; a third additional gain stage 340 having a negative input terminal 342 connected to node 324, a positive input terminal 344 connected to receive the first reference voltage REF1, and an output terminal 346 connected to node 332; a fourth cascoding transistor 350 having a drain 352 connected to node 336, a gate 354 connected to a node 356, and a source 358 connected to a node 360; a fourth additional gain stage 362 having a positive input terminal 364 connected to receive the second reference voltage REF2, a negative input terminal 366 connected to node 360, and an output terminal 368 connected to node 356; and a fourth current source transistor 372 having a drain 374 connected to node 360, a gate 376 connected to the second bias voltage BIAS2, and a source 378 connected to VSS.

The op-amp circuit 250 further includes: a first input transistor 382 having a drain 384 connected to node 260, a gate 386 coupled to receive an input voltage $V_{IN+}$, and a source 388 connected to a node 390; and a second input transistor 392 having a drain 394 connected to node 324, a gate 396 connected to receive a negative input voltage $V_{IN-}$, and a source 398 connected to node 390; and a current source 400 having a terminal 402 connected to node 390, and an opposite terminal connected to VSS. In order to optimize the bandwidth and noise performance of the op-amp circuit, the first and second input transistors 382 and 392 are both large in terms of channel width, area, and therefore in capacitance also.

The four current source transistors 252, 306, 316, and 372 provide proper biasing of the gain boosted cascoded op-amp circuit 250. In the depicted circuit, the first and third current source transistors 252 and 316 are both PMOS transistors. Also, in the depicted circuit, the second and fourth current source transistors 306 and 372 are both NMOS transistors. The first and third cascoded transistors 262 and 326 are both PMOS transistors, and the second and fourth cascoded transistors 284 and 350 are both NMOS transistors.

The capacitive loading at each of the first and second folding point nodes 260 and 324 is great because each of these nodes has three transistors coupled thereto. The source 264 of the first cascading transistor 262, the drain 258 of the first current source transistor 252, and the drain 384 of the first input transistor 382 are all connected to the first folding point node 260. The source 328 of the second cascoding transistor 326, the drain 322 of the third current source transistor 316 and the drain 394 of the second input transistor 392 are all connected to the second folding point node 324. Because first and second input transistors 382 and 392 are large transistors, the drain capacitances at the drains 384 and 394 of the input transistors are very large. Therefore, the first and second input transistors 382 and 392 contribute a large amount of the capacitive loading at the folding point nodes 260 and 324. The capacitive loading at each of the first and second folding point nodes 260 and 324 results in slow settling time and instability of the op-amp circuit 250.

Relationships (5) and (6), above, apply to the folded cascode topology CMOS gain enhanced op-amp circuit 250 (FIG. 4) which includes four gain boosted loops similar to the enhanced cascoded op-amp circuit 150 (FIG. 3A). The second pole frequency $\omega_6$ of the main amplifier formed by the first input transistor 382 and the first cascoding transistor 262 is associated with the first folding point node 260. The second pole frequency $\omega_6$ of the main amplifier formed by the second input transistor 392 and the cascoding transistor 326 is associated with the second folding point node 324. Because the capacitive loading at each of the folding point nodes 260 and 324 is great, the second pole frequency $\omega_6$ is limited. Under deep feedback, $\beta\omega_5$ is often not much smaller than $\omega_6$. Therefore, optimizing the unity gain bandwidth of the additional gain stage is not trivial.

The above described problem of slow settling of the main amplifier of the enhanced cascoded op-amp circuit 150 (FIG. 3A) used in feedback is exacerbated in the gain enhanced cascoded op-amp circuit 250 (FIG. 4) wherein the input transistors 382 and 392 are scaled very large to optimize the bandwidth and noise performance of the op-amp circuit. The large input transistors 382 and 392 have very high drain capacitance values. Therefore, the capacitive loading at the first and second folding point nodes is very large thereby causing a very low frequency 2nd pole. As a consequence, it is very difficult to design a gain-enhanced op-amp without introducing stability problems.

What is needed is a CMOS gain enhanced cascoded op-amp circuit including: a main amplifier including a cascoded transistor and an input transistor; and an additional, or enhancing, gain stage forming a closed gain boosting loop between the drain of the input transistor and gate of the cascoded transistor via a folding point node, wherein capacitive loading at the folding point nodes is reduced.

What is also needed is such a CMOS gain enhanced cascoded op-amp circuit wherein the second pole frequency $\omega_6$ of the main amplifier, which is associated with the capacitance at the folding point node, is pushed to a higher frequency inside the gain boosting loop.

What is further needed is such a CMOS gain enhanced cascoded op-amp circuit wherein the unity-gain frequency of the additional gain stage may be increased to reduce settling time of the main amplifier without sacrificing stability.

SUMMARY OF THE INVENTION

It is an object of the present invention to provide a CMOS gain enhanced cascoded op-amp circuit including: a main amplifier having a cascoded transistor and an input transistor; and an additional, or enhancing, gain stage forming a gain boosting loop between the drain of the input transistor and the gate of the cascoded transistor via a folding point node, wherein capacitive loading at the folding point nodes is reduced.

It is another object of the present invention to provide such a CMOS gain enhanced cascoded op-amp circuit wherein the unity-gain frequency of the additional gain stage is increased to reduce slow settling time of the main amplifier without sacrificing stability.

It is another object of the present invention to provide a CMOS gain enhanced folded cascode topology op-amp circuit having an improved power supply rejection ratio (PSRR).

Briefly, the present invention provides gain enhanced cascoded CMOS amplifier including: a cascoding transistor having its source connected to a folding point node, its drain connected to a first amplifier output terminal, and a gate, the folding point node being coupled to a first power supply terminal; a gain enhancing circuit having a negative input terminal coupled to the first folding point node, a positive input terminal responsive to a first reference voltage source, and an output terminal coupled to the gate of the first cascoding transistor; a first output coupling circuit coupling the first amplifier output terminal to a second power supply terminal; a first input transistor having a gate responsive to a first input voltage, a source, and a drain, the first input transistor having particular physical dimensions; and a first pole-isolating transistor having a drain connected to the first folding point node, a source connected to the drain of the first input transistor, and a gate responsive to an isolation bias voltage, the first pole isolating transistor having smaller physical dimensions than the particular physical dimensions of the first input transistor, wherein capacitive loading at the first folding point node is minimized to provide optimal settling behavior and stability in operation of the amplifier.

The pole isolation transistor is properly biased to operate in a saturation mode so that the output impedance looking into the drain of the pole isolation transistor is very large. The large drain impedance of the pole isolation transistor, seen from each of the folding point node effectively isolates the folding point nodes from the high drain capacitance of the large input transistor. The advantage of the pole isolation technique of the present invention is that the settling behavior of the gain-boosting loop is optimized independently without interaction with the 2nd-pole of a main amplifier. This leads to a much higher frequency, or faster, pole at the folding point node. Stability and slow-settling problems may be simultaneously solved without conflict by easy control of the unity-gain bandwidth of the gain enhancing circuit.

An important advantage of the present invention is that the second pole frequency of the gain-boosting loop is increased to a much higher frequency.

The unity-gain frequency of the additional gain stage is increased to reduce the slow settling of the main op-amp without sacrificing stability.

The large capacitive load associated with large input transistors no longer loads the gain boosting loop directly. This allows uncorrelated optimization for the system 2nd pole frequency and the stability of the gain-boosting loop.

The cascading effect of the isolation transistor shields the input transistors and further improves the power supply rejection ratio (PSRR) of the op-amp.

The isolation transistor is easily accommodated into the op-amp due to large headroom available at the folding point that is almost always true for the folded-cascoded structure. This allows easy design and optimization for the isolation transistor.

The pole isolation technique can be applied to the PMOS input folded-cascoded op-amps as well. The NMOS input structure is used here for the sole purpose of illustration.

The foregoing and other objects, features, and advantages of the present invention will be apparent from the following detailed description of the preferred embodiment which makes reference to the several figures of the drawing.

IN THE DRAWING

DETAILED DESCRIPTION OF THE PREFERRED EMBODIMENTS

Figure 5:
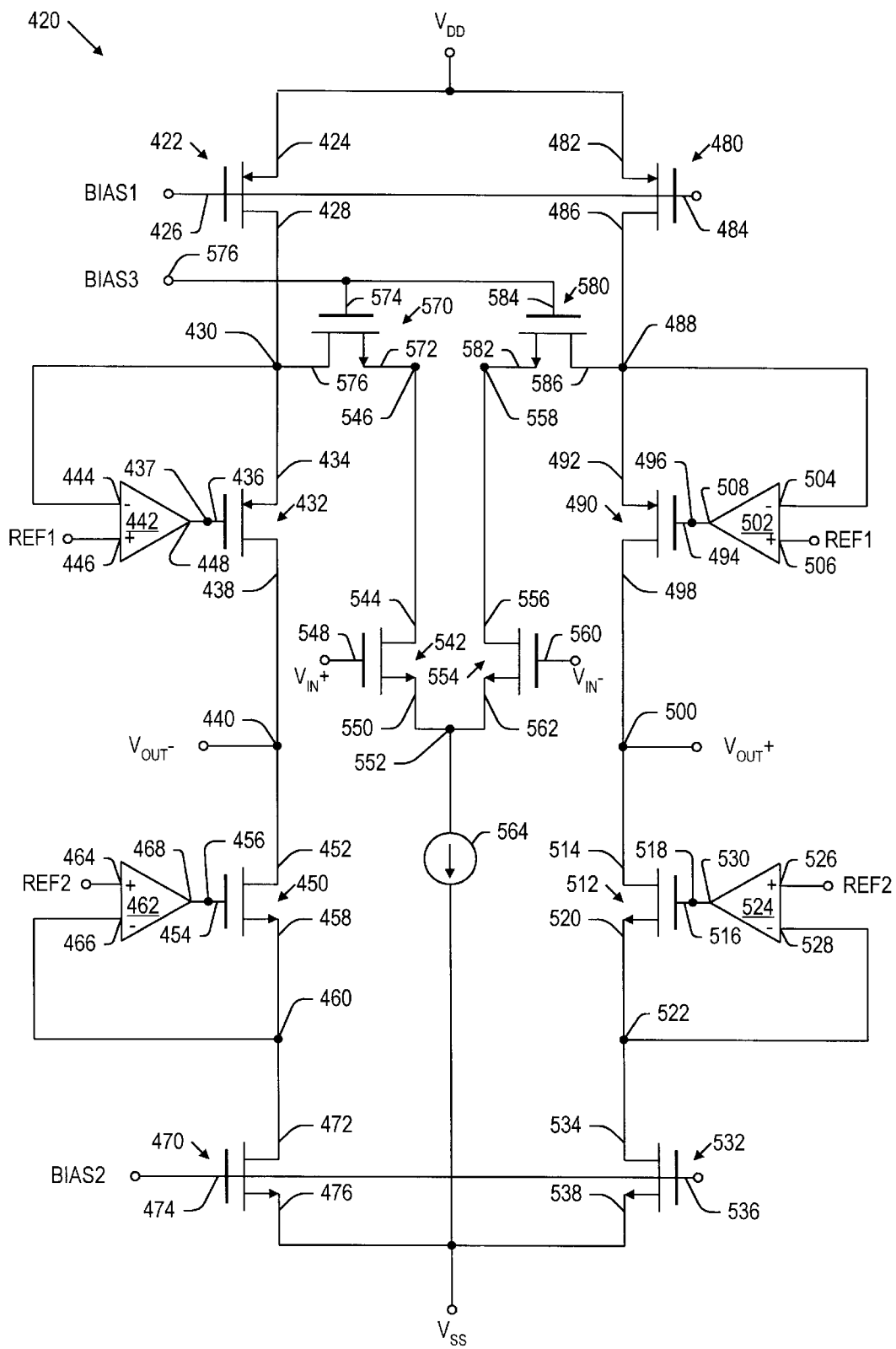
FIG. 5 is a schematic diagram of a gain boosted CMOS op-amp circuit including pole isolation transistors in accordance with the present invention.

FIG. 5 shows a schematic diagram at 420 of a filly differential CMOS gain enhanced cascoded op-amp circuit according to the present invention, the circuit 420 having a folded cascode topology. The circuit 420 includes: a first current source transistor 422 having a source 424 connected to a system voltage source VDD, a gate 426 connected to receive a first bias voltage BIAS1. and a drain 428 connected to a first folding point node 430; a first cascoding transistor 432 having a source 434 connected to node 430, a gate 436 connected to a node 437, and a drain 438 connected to a negative output terminal 440; a first additional gain stage 442 having a negative input terminal 444 connected to node 430, a positive input terminal 446 connected to receive a first reference voltage REF1, and an output terminal 448 connected to node 437; a second cascoding transistor 450 having a drain 452 connected to the negative output terminal 440, a gate 454 connected to a node 456, and a source 458 connected to a node 460; a second additional gain stage 462 having a positive input terminal 464 connected to receive a second reference voltage REF2, a negative input terminal 466 connected to node 460, and an output terminal 468 connected to node 456; and a second current source transistor 470 having a drain 472 connected to node 460, a gate 474 connected to receive a second bias voltage BIAS2, and a source 476 connected to VSS.

The circuit 420 also includes: a third current source transistor 480 having a source 482 connected to VDD, a gate 484 connected to receive the first bias voltage BIAS1, and a drain 486 connected a second folding point node 488; a third cascading transistor 490 having a source 492 connected to node 488, a gate 494 connected to a node 496, and a drain 498 connected to a positive output terminal 500; a third additional gain stage 502 having a negative input terminal 504 connected to node 488, a positive input terminal 506 connected to receive the first reference voltage REF1, and an output terminal 508 connected to node 496; a third cascading transistor 512 having a drain 514 connected to the positive output terminal 500, a gate 516 connected to a node 518, and a source 520 connected to a node 522; a fourth additional gain stage 524 having a positive input terminal 526 connected to receive a second reference voltage REF2, a negative input terminal 528 connected to node 522, and an output terminal 530 connected to node 518; and a fourth current source transistor 532 having a drain 534 connected to node 522, a gate 536 connected to receive the second bias voltage BIAS2, and a source 538 connected to VSS. The circuit 420 also includes: a first input transistor 542 having a drain 544 connected to a node 546, a gate 548 connected to receive a positive input voltage $V_{IN+}$, and a source 550 connected to a node 552; a second input transistor 554 having a drain 556 connected to a node 558, a gate 560 connected to receive a negative input voltage $V_{IN-}$, and a source 562 connected to node 552; and a current source 564 having a first terminal connected to node 552, and an opposite terminal connected to VSS. The input transistors 542 and 554 are implemented as large transistors to optimize the bandwidth and noise performance of the op-amp circuit 420. The four current source transistors 422, 470, 480, and 532 provide proper biasing of the gain boosted cascoded op-amp circuit 420.

In accordance with the present invention, the circuit 420 further includes a first pole isolation transistor 570 having a source 572 connected to node 546, a gate 574 connected to a third bias terminal 576 coupled to receive a third bias voltage BIAS3, and a drain 576 connected to the first folding point node 430; and second pole isolation transistor 580 having a source 582 connected to node 558, a gate 584 connected to the third bias terminal 576, and a drain 586 connected to the second folding point node 488.

In the preferred embodiment of the present invention: the input transistors 542 and 554 are both NMOS transistors; the first and third current source transistors 422 and 480 are PMOS transistors; the second and fourth current source transistors 470 and 532 are NMOS transistors; the pole isolation transistors 570 and 580 are NMOS transistors; the first and third cascoding transistors 432 and 490 are PMOS transistors; and the second and fourth cascoding transistors 450 and 512 are NMOS transistors. In alternative embodiment of the present invention, each of the NMOS transistors is substituted for a PMOS transistor, and each of the PMOS transistors is substituted for an NMOS transistor.

Because the input transistors 542 and 554 must be implemented as large transistors to optimize the bandwidth and noise performance of the op-amp circuit 420, the drain capacitances at the drains 544 and 556 of the input transistors is very large. As described above, in prior art gain enhanced cascoded CMOS s without pole isolation transistors, the large drain capacitances at the drains of the input transistors causes a capacitive loading at the folding point nodes 430 and 488 which results in slow settling time and instability of the prior art op-amp circuit. These problems are solved in the circuit 420 of the present invention by the provision of the pole isolation transistors 570 and 580.

In the preferred embodiment of the present invention, the pole isolation transistors 570 and 580 are approximately ten times smaller, in terms of channel width, area, and capacitance than the large input transistors 542 and 554. Also in the preferred embodiment, the pole isolation transistors 570 and 580 are properly biased to operate in a saturation mode. With the pole isolation transistors operating in a saturation mode, the output impedance looking into each of the drains 576 and 586 of the pole isolation transistors 570 and 580 is very large. The large drain impedances of the pole isolation transistors, seen from each of the folding point nodes 430 and 488 respectively, effectively isolate the folding point nodes 430 and 488 from the high drain capacitances of the large input transistors 542 and 554.

The isolation of high drain capacitances of the large input transistors 542 and 554 from the folding point nodes 430 and 488 by the pole isolation transistors 570 and 580 nullifies the correlations between the frequency responses of the additional gain stages 442 and 502 and the 2nd pole of the main amplifiers.

An advantage of the pole isolation technique of the present invention is that the settling behaviors of the gain-boosting loops are optimized independently without interaction with the 2nd-pole of the main amplifiers.

This leads to much higher frequency poles at the folding point nodes 430 and 488 and results in an increased design room between $\beta\omega_5$ and $\omega_6$.

Stability and slow-settling problems can be simultaneously solved without conflict by easy control of the unity-gain bandwidth of the additional amplifier Another pole introduced by the isolation transistor is also at high frequency because of the large gm of the NMOS transistor compared to that of the PMOS.

Figure 1A:
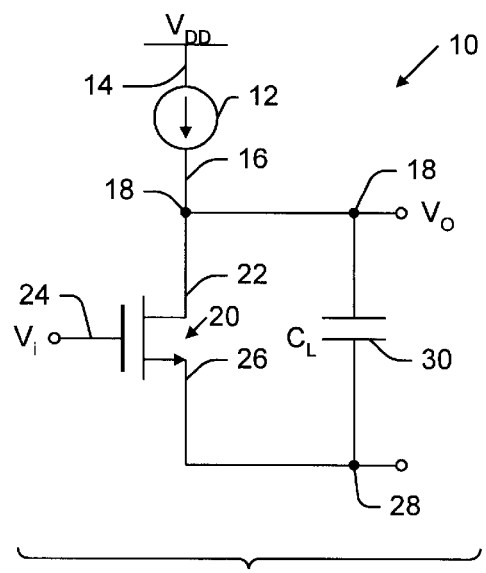
FIG. 1A is a schematic diagram of a typical complementary metal oxide semiconductor (CMOS) operational amplifier (op-amp) circuit having a single transistor.
Figure 1B:
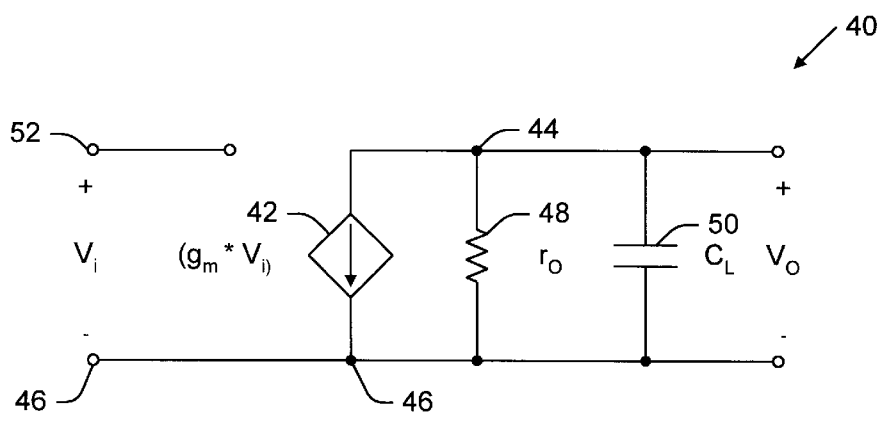
FIG. 1B is a schematic diagram an AC small signal equivalent circuit modeling the circuit of FIG. 1A.
Figure 1C:
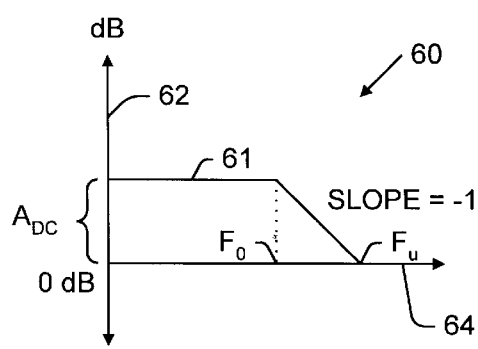
FIG. 1C is a bode plot of the frequency response of the circuit of FIG. 1A.
Figure 2A:
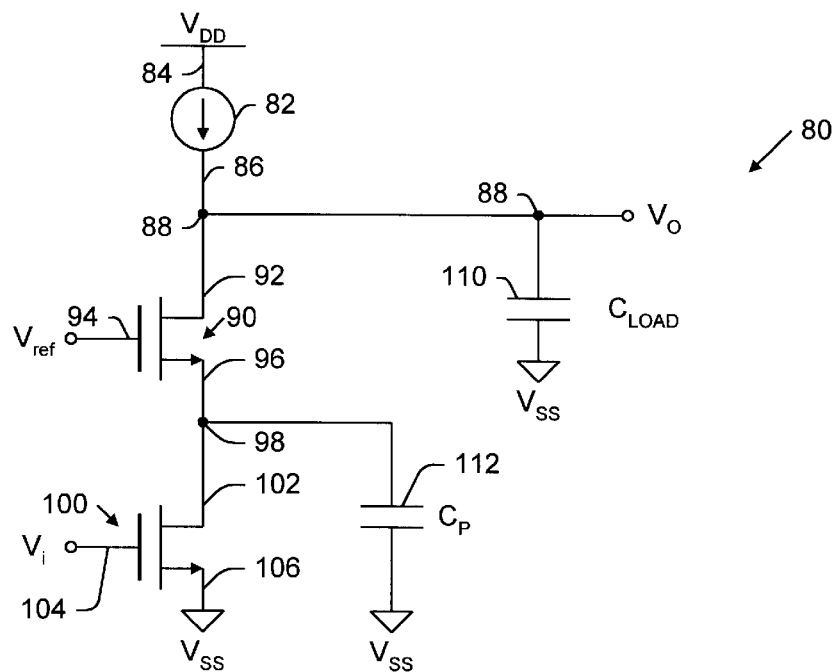
FIG. 2A is a schematic diagram of a typical CMOS cascoded gain stage.
Figure 2B:
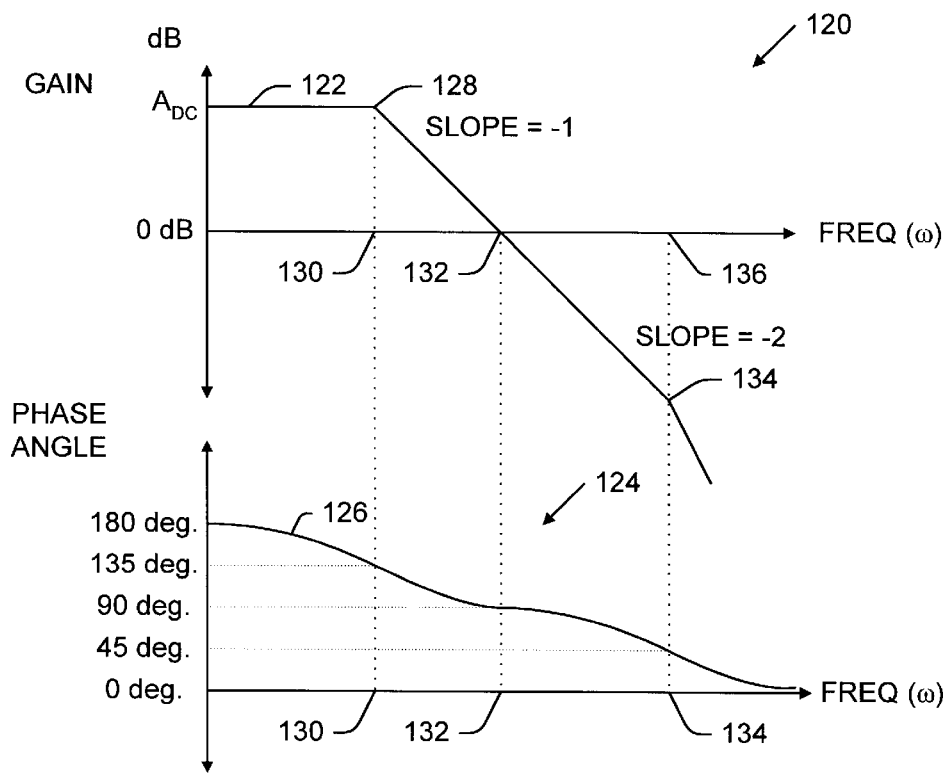
FIG. 2B is a diagram showing a pair of graphs illustrating the gain and phase angle of the cascoded gain stage of FIG. 2A as a function of frequency on a log scale.
Figure 3A:
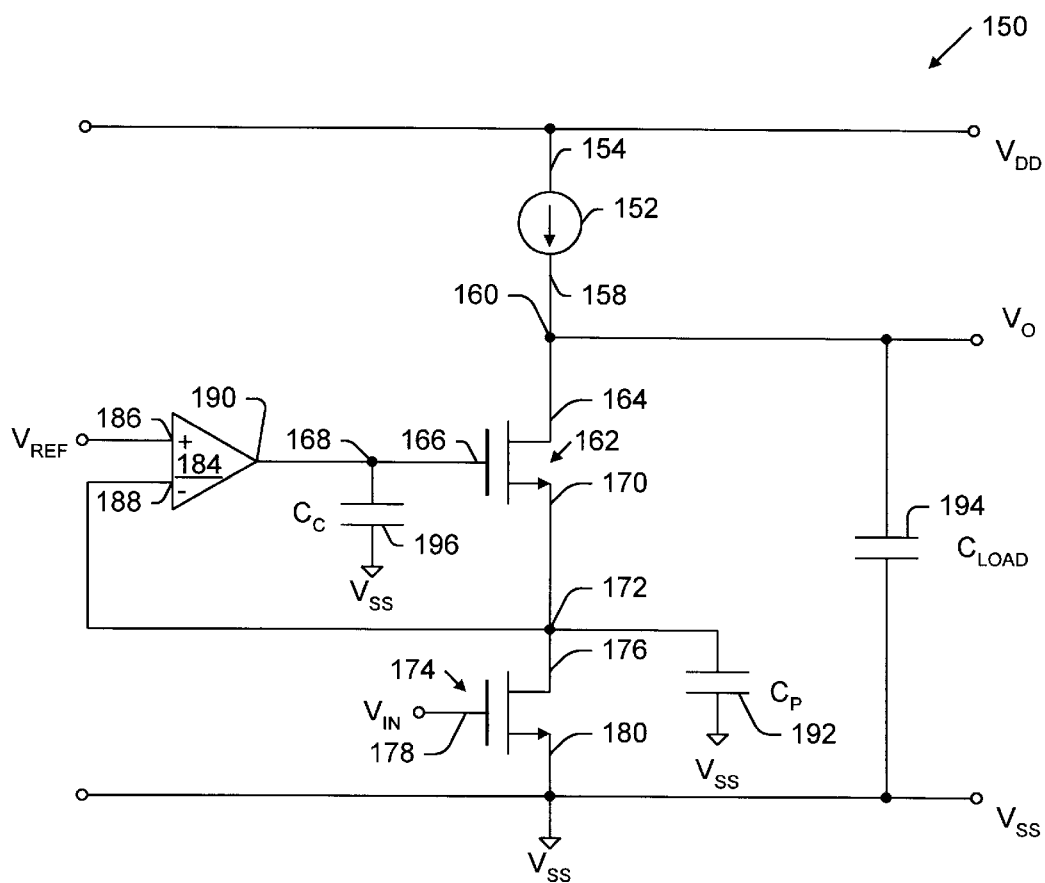
FIG. 3A is a schematic diagram of a prior art gain enhanced cascoded CMOS gain stage.
Figure 3B:
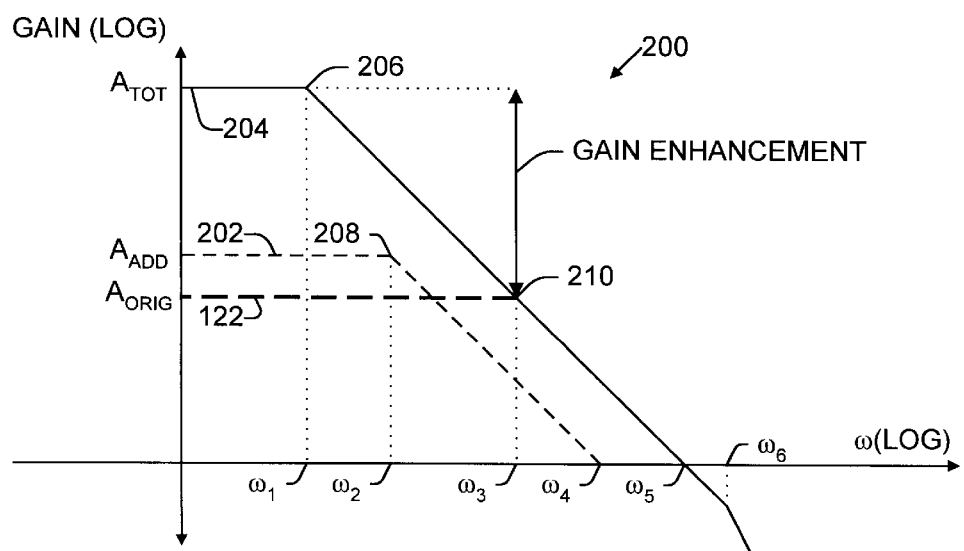
FIG. 3B is a graph including a first bode plot of the gain of the cascoded op-amp circuit of FIG. 2A, a second bode plot of an additional gain $A_{add}$ of an additional gain-stage of the circuit of FIG. 3A, and a third bode plot of the total gain of the circuit of FIG. 3A.
Figure 3C:
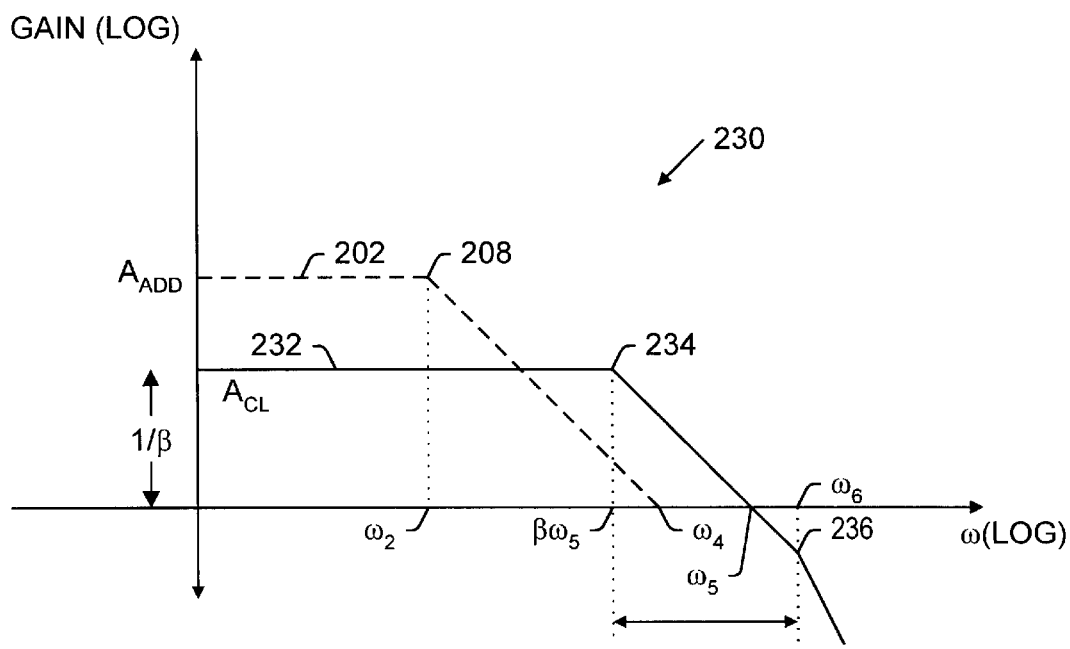
FIG. 3C is a graph including a bode plot of the closed loop gain of the circuit of FIG. 3A.
Figure 4:
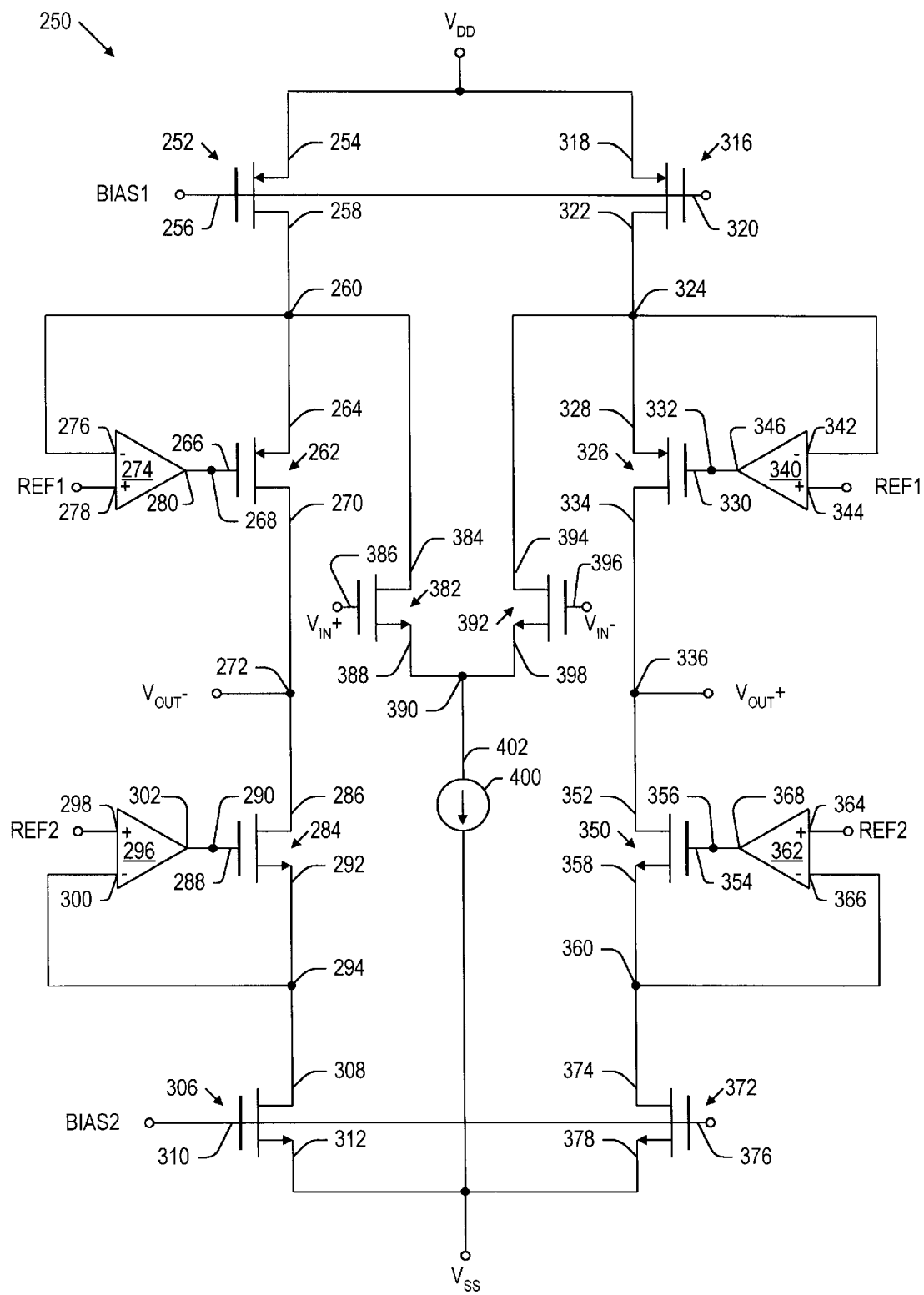
FIG. 4 is a schematic diagram of a fully differential prior art gain boosted CMOS op-amp circuit having a folded cascode topology.
Figure 6:
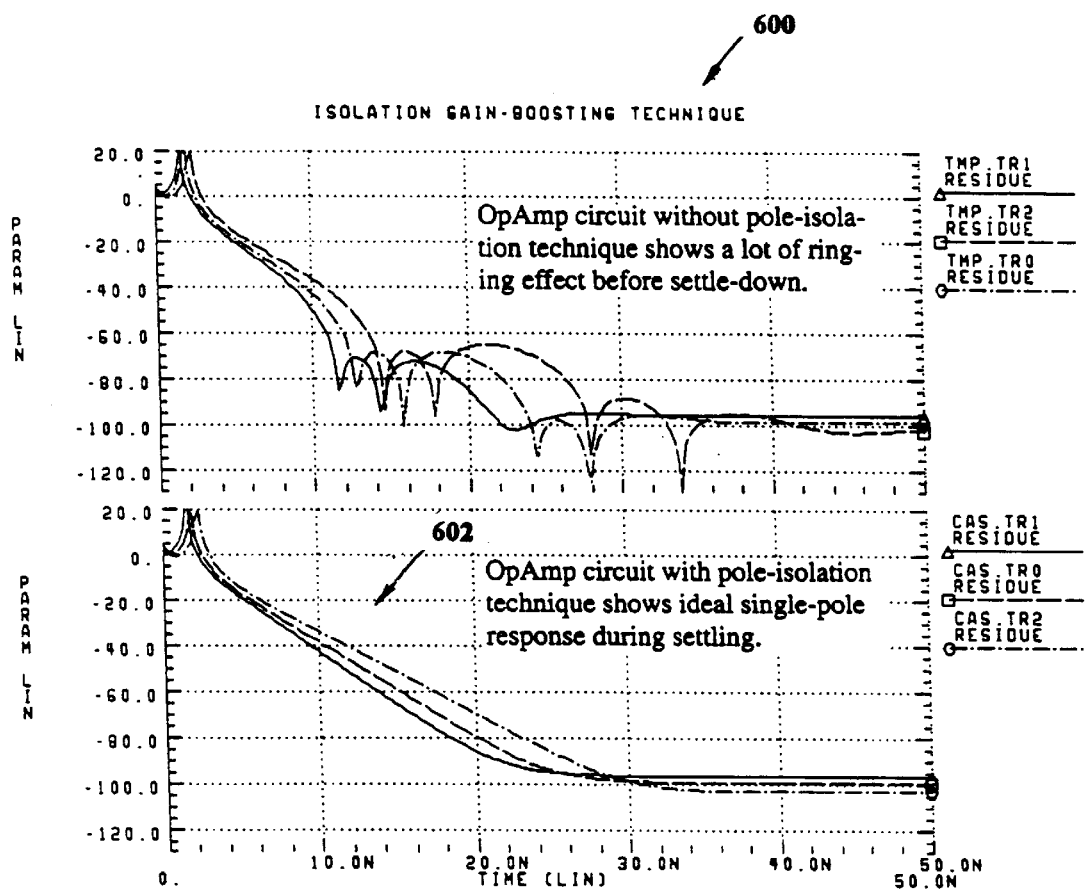
FIG. 6 shows a plot of simulated relative settling errors as a function of time of the gain boosted op-amp circuit according to the present invention versus the prior art gain boosted op-amp circuit of FIG. 4.

FIG. 6 shows: a first graph at 600 of HSPICE simulation results of relative settling error as a function of time of the gain boosted op-amp circuit 420 (FIG. 5) according to the present invention; and a second graph at 602 of HSPICE simulation results of relative settling error as a function of time of the prior art gain boosted op-amp circuit 250 (FIG. 4).

The settling behavior of an op-amp can be judged very well by a plot of the relative settling error versus time. The first graph 600 includes three plots of HSPICE simulation results of relative settling error as a function of time of the gain boosted op-amp circuit 420 (FIG. 5) according to the present invention corresponding to fast, nominal and slow modes of process variation.

The second graph 602 includes three plots of HSPICE simulation results of relative settling error as a function of time of the prior art gain boosted op-amp circuit 250 (FIG. 4) corresponding to fast, nominal and slow modes of process variation.

By introducing the isolation transistor, the 2nd pole is pushed to a much higher frequency inside the gain-boosting loop thereby increasing the unity-gain frequency of the additional amplifier to eliminate the slow settling of the main op-amp without sacrificing stability.

The large capacitive load associated with large input transistors no longer loads the gain boosting loop directly. This allows uncorrelated optimization for the system 2nd pole frequency and the stability of the gain-boosting loop.

The cascading effect of the isolation transistor shields the input devices and further improves the PSRR (power supply rejection ratio) of the op-amp.

The isolation transistor is easily accommodated into the op-amp due to large headroom available at the folding point that is almost always true for the folded-cascoded structure. This allows easy design and optimization for the isolation transistor.

Although the present invention has been particularly shown and described above with reference to a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A gain enhanced cascoded CMOS amplifier comprising:
    a first folding point gain enhanced transistor means connected between a first folding point node and a first amplifier output terminal, said first folding point node being coupled to a first power supply terminal;
    a first output coupling circuit coupling said first amplifier output terminal to a second power supply terminal;
    a first input transistor having a gate responsive to a first input voltage, a source, and a drain, said first input transistor having particular physical dimensions; and
    a first pole-isolating transistor having a drain connected to said first folding point node, a source connected to said drain of said first input transistor, and a gate responsive to an isolation bias voltage, said first pole isolating transistor having smaller physical dimensions than said particular physical dimensions of said first input transistor, wherein capacitive loading at said first folding point node is minimized to provide optimal settling behavior and stability in operation of said amplifier.

2. A gain enhanced cascoded CMOS amplifier as recited in claim 1 wherein said first folding point gain enhanced transistor means comprises:
    a first cascading transistor having its source connected to said first folding point node, its drain connected to said first amplifier output terminal, and a gate; and
    a first gain enhancing circuit having a negative input terminal coupled to said first folding point node, a positive input terminal responsive to a first reference voltage source, and an output terminal coupled to said gate of said first cascoding transistor.

3. A gain enhanced cascoded CMOS amplifier as recited in claim 2 wherein:
    said first folding point node is coupled to said first power supply terminal via a first current source transistor having its drain connected to said first folding point node, its source connected to said first power supply terminal, and its gate connected to a first bias voltage source; and
    said first output coupling circuit includes,
    a second cascoding transistor having its drain connected to said first amplifier output terminal, a source, and a gate,
    a second gain enhancing circuit having a negative input terminal coupled to said source of said second cascoding transistor, a positive input terminal responsive to a second reference voltage, and an output terminal coupled to said gate of said second cascading transistor.

4. A gain enhanced cascoded CMOS amplifier as recited in claim 3 wherein said first output coupling circuit further includes a second current source transistor having a drain connected to said source of said second gain enhanced transistor, a source connected to a second power supply terminal, and a gate connected to a second bias voltage source.

5. A gain enhanced cascoded CMOS operational amplifier circuit as recited in claim 4 further comprising:
    a second folding point gain enhanced transistor means connected between a second folding point node and a second amplifier output terminal, said second folding point node being coupled to said first power supply terminal;

a second output coupling circuit coupling said second amplifier output terminal to said second power supply terminal;

a second input transistor having a gate responsive to a second input voltage, a source connected to said source of said first input transistor, and a drain, said second input transistor having particular physical dimensions; and second pole-isolating transistor having a drain connected to said second folding point node, a source connected to said drain of said second input transistor, and a gate responsive to said isolation bias voltage, said second pole isolating transistor having smaller physical dimensions than said particular physical dimensions of said second input transistor, wherein capacitive loading at said second folding point node is minimized to provide optimal settling behavior and stability during operation of said amplifier.

6. A gain enhanced cascoded CMOS amplifier as recited in claim 5 wherein said second folding point gain enhanced transistor comprises:

a third cascading transistor having its source connected to said second folding point node, its drain connected to a second amplifier output terminal, and a gate; and a third gain enhancing circuit having a negative input terminal coupled to said second folding point node, a positive input terminal responsive to said first reference voltage source, and an output terminal coupled to said gate of said third cascading transistor.

7. A gain enhanced cascoded CMOS amplifier as recited in claim 6 wherein:

said second folding point node is coupled to said first power supply terminal via a third current source transistor having its drain connected to said second folding point node, its source connected to said first power supply terminal, and its gate connected to a first bias voltage source; and said second output coupling circuit coupling includes,
a fourth cascoding transistor having its drain connected to said second amplifier output terminal, a source, and a gate,
a fourth gain enhancing circuit having a negative input terminal coupled to said source of said fourth cascoding transistor, a positive input terminal responsive to said second reference voltage, and an output terminal coupled to said gate of said fourth cascoding transistor.

8. A gain enhanced cascoded CMOS amplifier as recited in claim 7 wherein said second output coupling circuit further includes a fourth current source transistor having its drain connected to said source of said fourth cascoding transistor, its source connected to said second power supply terminal, and its gate connected to said second bias voltage source.

9. A gain enhanced cascoded CMOS operational amplifier circuit as recited in claim 4 wherein:

said first and second input transistors are NMOS transistors; and said first and second cascading transistors are PMOS transistors.

10. A gain enhanced cascoded CMOS operational amplifier circuit as recited in claim 4 wherein:

said first and second input transistors are PMOS transistors; and said first and second cascoding transistors are NMOS transistors.

11. A gain enhanced cascoded CMOS amplifier as recited in claim 5 further comprising a current source having a first terminal connected to said sources of said first and second input transistors, and a second terminal connected to said second power supply terminal.

12. A gain enhanced cascoded CMOS amplifier as recited in claim 5 wherein said first amplifier output terminal is connected to said second bias voltage source.

13. A fully differential gain enhanced cascoded CMOS amplifier comprising:

a first cascading transistor having its source connected to a first folding point node, its drain connected to a first amplifier output terminal, and a gate, said first folding point node being coupled to a first power supply terminal;

a first gain enhancing circuit having a negative input terminal coupled to said first folding point node, a positive input terminal responsive to a first reference voltage source, and an output terminal coupled to said gate of said first cascading transistor;

a first output coupling circuit coupling said first amplifier output terminal to a second power supply terminal;

a first input transistor having a gate responsive to a first input voltage, a source, and a drain, said first input transistor having particular physical dimensions;

a first pole-isolating transistor having a drain connected to said first folding point node, a source connected to said drain of said first input transistor, and a gate responsive to an isolation bias voltage, said first pole isolating transistor having smaller physical dimensions than said particular physical dimensions of said first input transistor, wherein capacitive loading at said first folding point node is minimized to provide optimal settling behavior and stability in operation of said amplifier;

a second cascading transistor having its source connected to a second folding point node, its drain connected to a second amplifier output terminal, and a gate;

a second enhancing circuit having a negative input terminal coupled to said second folding point node, a positive input terminal responsive to said first reference voltage source, and an output terminal coupled to said gate of said third cascoding transistor;

a second output coupling circuit coupling said second amplifier output terminal to said second power supply terminal;

a second input transistor having a gate responsive to a second input voltage, a source connected to said source of said first input transistor, and a drain, said second input transistor having particular physical dimensions; and a second pole-isolating transistor having a drain connected to said second folding point node, a source connected to said drain of said second input transistor, and a gate responsive to said isolation bias voltage, said second pole isolating transistor having smaller physical dimensions than said particular physical dimensions of said second input transistor, wherein capacitive loading at said second folding point node is minimized to provide optimal settling behavior and stability during operation of said amplifier.

14. A gain enhanced cascoded CMOS amplifier as recited in claim 13 wherein:

said first folding point node is coupled to said first power supply terminal via a first current source transistor having its drain connected to said first folding point node, its source connected to said first power supply terminal, and its gate connected to a first bias voltage source; and said first output coupling circuit includes,
a second cascoding transistor having its drain connected to said first amplifier output terminal, a source, and a gate,
a second gain enhancing circuit having a negative input terminal coupled to said source of said second cascoding transistor, a positive input terminal responsive to a second reference voltage, and an output terminal coupled to said gate of said second cascading transistor.

15. A gain enhanced cascoded CMOS operational amplifier circuit as recited in claim 13 wherein:

said first and second input transistors are NMOS transistors; and said first and second cascoding transistors are PMOS transistors.

16. A gain enhanced cascoded CMOS operational amplifier circuit as recited in claim 13 wherein:

said first and second input transistors are PMOS transistors; and said first and second cascoding transistors are NMOS transistors.

17. A gain enhanced cascoded CMOS amplifier as recited in claim 13 wherein said first amplifier output terminal is connected to said second bias voltage source.

18. A method for optimizing settling behavior and stability of a gain enhanced cascoded CMOS amplifier having a folding point topology and including a cascading transistor having a source connected to a folding point node, a gain enhancing circuit having a negative input terminal coupled to said folding point node, and an output terminal coupled to said gate of said cascoding transistor, and an input transistor having a gate responsive to an input voltage, and a drain, said input transistor having particular physical dimensions, said method comprising the steps of:

providing a pole-isolating transistor having a drain connected to said folding point node, a source connected to said drain of said input transistor, and a gate responsive to a bias voltage, said pole isolating transistor having smaller physical dimensions than said particular physical dimensions of said input transistor, whereby capacitive loading at said folding point node is minimized to provide optimal settling behavior and stability in operation of said amplifier.

19. A method for optimizing settling behavior and stability of a gain enhanced cascoded CMOS amplifier as recited in claim 18 wherein components of said gain enhancing circuit are selected so that said gain enhancing circuit provides a unity gain bandwidth which is less than a pole frequency associated with said folding point node.

20. A method for optimizing settling behavior and stability of a gain enhanced cascoded CMOS amplifier as recited in claim 18 further comprising the step of biasing said pole-isolating transistor in saturation region so that the impedance looking into said drain of said pole-isolating transistor is maximized to provide an optimal isolation effect.

* * * * *